(12) United States Patent
Behammer

(10) Patent No.: US 7,084,047 B2
(45) Date of Patent: Aug. 1, 2006

(54) METHOD FOR THE PRODUCTION OF INDIVIDUAL MONOLITHICALLY INTEGRATED SEMICONDUCTOR CIRCUITS

(75) Inventor: Dag Behammer, Ulm (DE)

(73) Assignee: United Monolithic Semiconductors GmbH, Ulm (DE)

( * ) Notice: Subject to any disclaimer, the term of this patent is extended or adjusted under 35 U.S.C. 154(b) by 0 days.

(21) Appl. No.: 10/524,251

(22) PCT Filed: Jul. 26, 2003

(86) PCT No.: PCT/EP03/08276

§ 371 (c)(1),
(2), (4) Date: Feb. 9, 2005

(87) PCT Pub. No.: WO2004/027859

PCT Pub. Date: Apr. 1, 2004

(65) Prior Publication Data

US 2005/0266660 A1 Dec. 1, 2005

(30) Foreign Application Priority Data

Aug. 22, 2002 (DE) .............................. 102 38 444

(51) Int. Cl.
*H01L 21/46* (2006.01)

(52) U.S. Cl. ........................ 438/464; 438/458; 438/459

(58) Field of Classification Search .................... None
See application file for complete search history.

(56) References Cited

U.S. PATENT DOCUMENTS

| 4,722,130 A | 2/1988 | Kimura et al. |
| 5,597,767 A * | 1/1997 | Mignardi et al. ............. 438/14 |
| 5,919,713 A | 7/1999 | Yoji et al. |
| 6,215,194 B1 | 4/2001 | Nakabayashi |
| 6,448,151 B1 | 9/2002 | Tateishi |
| 6,756,288 B1 | 6/2004 | Feil et al. |
| 2001/0005043 A1 | 6/2001 | Hiroji et al. |
| 2002/0022343 A1 | 2/2002 | Yasunori |
| 2002/0055238 A1 | 5/2002 | Casebeer |

FOREIGN PATENT DOCUMENTS

| JP | 01 048423 A | 6/1989 |
| JP | 04 144245 | 9/1992 |
| JP | 06 244277 | 11/1994 |
| WO | WO 99/25 019 A1 | 5/1999 |
| WO | WO 01/03 180 A1 | 1/2001 |

* cited by examiner

Primary Examiner—Ha Nguyen
Assistant Examiner—Cheung Lee
(74) Attorney, Agent, or Firm—Collard & Roe, P.C.

(57) ABSTRACT

A method for the production of individual integrated circuit arrangements from a wafer composite is disclosed, whereby the wafer is fixed with the component side (FS) on a support, the individual circuit arrangements (21) are separated on the support body by the etching of separating trenches (27) and individually lifted from the support body. The semiconductor substrate (20) is reduced in thickness during the fixing of the wafer to the support body, preferably to a substrate thickness of less than 100 μm. A reverse face metallization (31) is deposited on the back face (RS) of the thinned substrate, preferably after separation of the circuit arrangements on the support body.

9 Claims, 3 Drawing Sheets

Figure 1:
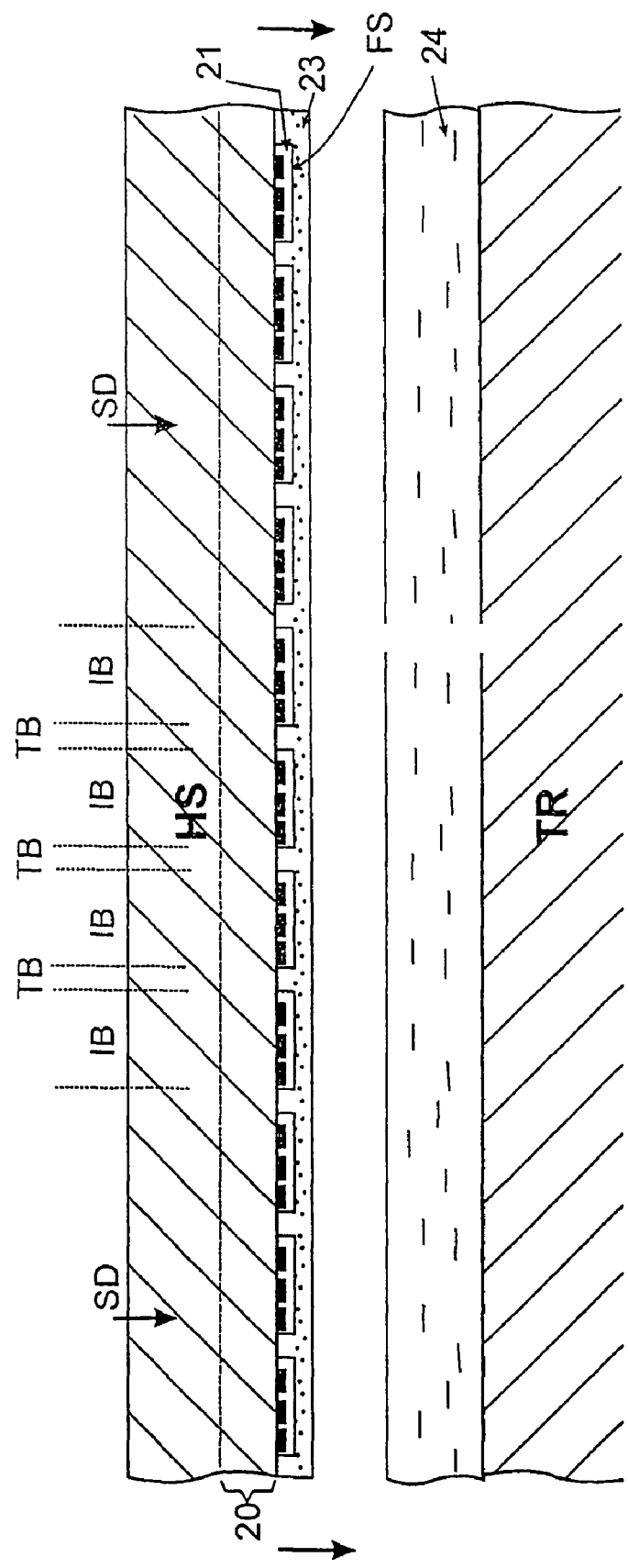

METHOD FOR THE PRODUCTION OF INDIVIDUAL MONOLITHICALLY INTEGRATED SEMICONDUCTOR CIRCUITS

CROSS REFERENCE TO RELATED APPLICATIONS

Applicant claims priority under 35 U.S.C. §119 of German Application No. 102 38 444.4 filed on Aug. 22, 2002. Applicant also claims priority under 35 U.S.C. §365 of PCT/EP03/008276 filed on Jul. 26, 2003. The international application under PCT article 21(2) was not published in English.

The invention relates to a method for the production of individual monolithically integrated semiconductor circuits.

In the production of integrated semiconductor circuits, also referred to simply as ICs or chips, a greater number of circuits are typically produced simultaneously on a thin semiconductor wafer, as the substrate, which circuits are subsequently separated in a later method step, particularly by means of sawing or cutting the wafer. The ICs typically have a plurality of components on a front face of the substrate, and a back face metallization on the back face, whereby the back face metallization lies at reference potential and can be electrically connected with individual conductive surfaces on the front face, by way of passage holes (vias) through the substrate.

In the case of a method known from U.S. Pat. No. 6,448,151 B2, the separation of individual chips from a wafer takes place mechanically, in that trenches are sawed into the wafer from the back face, using a thin saw blade, which trenches reach so far into the substrate that even after the substrate is reduced in thickness, these trenches are still present. Final separation takes place after the wafer has been turned over, from the front face, again by means of sawing.

In the case of a method described in U.S. 2002/00 55 238 A1, trenches are sawed into a wafer from the circuit side, and in the case of a wafer glued onto an intermediate carrier with the circuit side, the substrate is worn away, from the back, to the desired thickness, whereby the trenches sawed previously are so deep that after the substrate is reduced in thickness, the individual chips are separated from one another in the substrate plane. The chips, which are still located in the glued laminate, are attached to a second carrier with the back face, and the first intermediate carrier is removed. Afterwards, the interstices between the chips separated in the substrate plane are made deeper by means of an upper partial layer of the second carrier, and the chips in the laminate of substrate and upper layer of the second carrier are individually removed from the lower layer of the second carrier.

In U.S. 2001/00 05 043 A1, exemplary embodiments are indicated, among other things, in which the wafer is attached to a carrier with the component side. After the substrate has been reduced in thickness from the back, vias and separating trenches are etched, and the back face is provided with a back face metallization, over its entire area. A metal strip that surrounds the individual components on the component side serves as an etch stop in the region of the separating trenches and initially bridges these separating trenches, so that the individual chips are still connected by way of the metallization and the metal frames on the component side. In a first example, the chips in the laminate are turned over and attached to a carrier tape with the back face, and mechanically separated, in this position, along the remaining connections by way of the metal strips. In another method of procedure, the separation of the metallic chip connections remaining in the region of the separating trenches takes place with the component side facing the carrier, and the elements are subsequently taken over onto a carrier tape.

U.S. Pat. No. 4,722,130: A describes a method in which trenches are mechanically worked into the substrate from the component side, and the substrate is subsequently glued onto a first intermediate carrier. After the substrate has been reduced in thickness from the back face, thin material gates remain standing at the locations of the milled separating trenches, so that the substrate continues to form a rigid composite. On the back face, a semi-rigid connecting layer and a PVC carrier are then applied, and the first intermediate carrier is removed. By means of heating and expansion of the PVC carrier, the remaining thin substrate gates are torn open and the individual chips are mechanically separated in this manner.

In U.S. Pat. No. 6,215,194, the individual chips of a wafer, which are glued onto a carrier, are separated by means of milling separating trenches in the substrate plane, and are removed from the composite by means of a separate separating tool, and pressed onto and glued onto a chip carrier.

In the case of a method known from WO 99/25 019 A1 for reducing the thickness of wafers, separating trenches are worked into a semiconductor substrate from the component side, and the substrate is glued onto a carrier with the component side. Afterwards, the substrate is worn away from the back face, all the way to the trenches.

In WO 01/03 180 A1, as well, trenches are made in the semiconductor substrate from the component side, whereby this can take place both mechanically and by means of dry etching, and after the wafer has been glued onto a rigid carrier, the back face is worn down all the way to the trenches, so that the chips are present on the carrier, separated in the substrate plane.

The present invention is based on the task of indicating an advantageous method for the production of individual monolithically integrated semiconductor circuits.

The invention is described in the independent patent claim. The dependent claims contain advantageous embodiments and further developments of the invention.

The invention makes secure and stable handling of the wafer possible in critical method steps, particularly in the case of low thickness of the substrate. According to an advantageous embodiment, the substrate is reduced in thickness to a substrate thickness of less than 100 µm, after completion of the semiconductor circuits, including the conductive surfaces and, if necessary, passivation of the front face. This is particularly advantageous for semiconductor circuits on a GaAs substrate, since GaAs possesses low heat conductivity, and the removal of waste heat to a heat sink, during operation, is significantly improved in the case of a low substrate thickness. Because of the low substrate thickness, the opening cross-section of the passage holes that widen from the front face to the back face is also reduced, so that the packing density of the circuits can be increased in the case of the thin substrate.

Attachment of the wafer to a rigid carrier before reducing the thickness of the substrate guarantees stable and secure handling even in the case of very low substrate thickness brought about by great reduction in thickness of the wafer. In particular, even non-level deformation of the wafer due to thermal influences or, in particular, also due to internal mechanical stresses in the semiconductor material, as they are typical for hetero-structure semiconductor layer sequences, is avoided.

It is advantageous that an electrical function test, particularly with regard to high-frequency behavior, is also performed only after separation of the individual components and thereby when the back face metallization is present and interfacial connections through the passage holes, on completely connected units, has taken place.

Attachment of the uniform wafer to the rigid carrier, which can be a sapphire, for example, takes place by means of an attachment layer made of preferably adhesive material, particularly an adhesive, a paste, a gel, or the like, which can also follow uneven parts of the surface of the wafer front face, which has been passivated, if necessary. An adhesive attachment material whose adhesion to the front face of the wafer is lower at greater temperatures is preferred. Individual release of the mechanically separated ICs from the carrier preferably takes place by means of mechanical lifting, overcoming the adhesion force, for which purpose the IC is heated, preferably by way of the carrier body, in the case of the preferred attachment material, in order to reduce the release force. To release the individual ICs, it is advantageous to use a tool in the manner of vacuum tweezers.

It is advantageous if the several ICs of a wafer attached to a carrier are separated laterally in the wafer plane, in such a manner that separating trenches are etched from the back face of the substrate, which faces away from the carrier body, which trenches advantageously reach at least to or into the attachment material. During etching of the separating trenches, it is advantageous if lateral under-etching is produced in the attachment material, underneath the wafer. This makes it possible to deposit the metal for the back face metallization and the interfacial connection after completion of the separating trenches, as well, over the entire area, without any metallization bridge being formed over the separating trenches. The metallization layer is interrupted at the steps that occur at the under-etchings.

According to a particularly advantageous embodiment, the passage holes through the substrate and the separating trenches can be produced in a common etching process, particularly using a common photolithographic etching mask and/or at least partially common etching agents. In this connection, advantage can advantageously be taken of the fact that in the case of conventional etching of the passage holes, the conductive surfaces on the front face act as an etch stop, and no conductive surfaces are provided in the regions between adjacent ICs of the wafer, so that etching continues into the attachment material in the region of the separating trenches, while it stops at the conductive surfaces of the front face in the region of the passage holes. This results in a particularly simple course of the method.

After individually lifting the ICs separated in the substrate plane, as individual chips, from the carrier body, the chips are individually treated further; this can include, for example, cleaning procedures, but particularly also testing procedures with optical surface testing and electrical function testing, for example. It is advantageous if the step of optical testing simultaneously includes orientation of the chips in a defined position for tip contacting, for the electrical function test. The tested chips can be deposited onto intermediate carriers, which are known as "blue tape" or "gel pack," for delivery to the customer and/or intermediate storage, or can be installed into circuit modules directly, without such an intermediate step.

Figure 3:
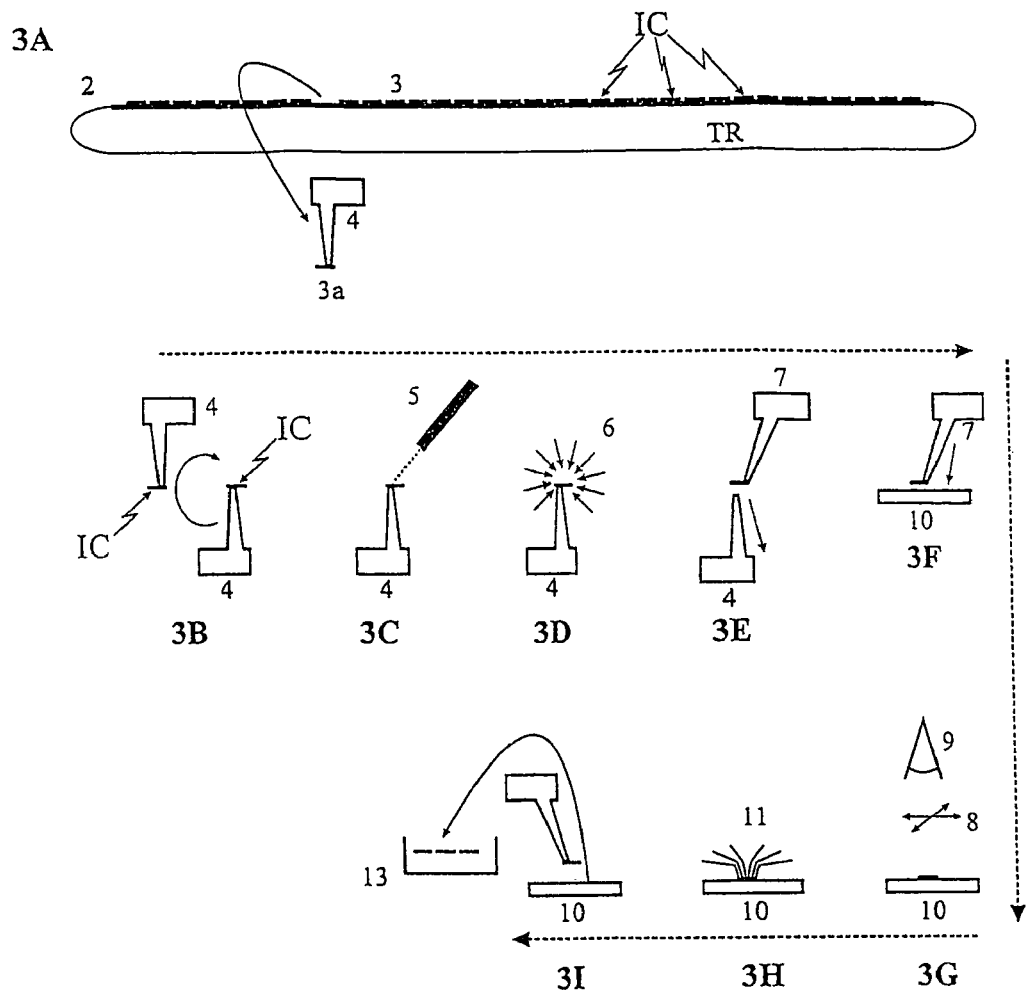

In the following, the invention will be explained in greater detail using preferred exemplary embodiments. The drawings show:

FIG. 1 a side view of a wafer on a carrier,

FIG. 2 a preferred back treatment of a wafer,

FIG. 3 the treatment of separated integrated circuits.

FIG. 1 shows a side view of a cross-section through a dielectric carrier body TR, for example a sapphire, and through a wafer WA, which contains a plurality of individual integrated circuits having semiconductor components and metallic conductive surfaces on the front face FS of a semiconductor substrate HS.

The wafer WA is covered with an inorganic protective layer 23 on the front face FS that faces down in FIG. 1. The surface of the carrier body TR that faces the wafer is provided with a glue material. The wafer is pressed onto the glue material with the surface of the protective layer 23, and fixed in place adhesively by this material, on the carrier TR. After fixation of the wafer on the carrier, the substrate is reduced in thickness from the back face, which faces away from the carrier, to the thickness indicated with the broken line, particularly to less than 100 μm (arrows DS), preferably by means of grinding.

In FIG. 2, the starting point is a wafer still fixed in place on the carrier body by way of the glue material 24, with the substrate reduced to the desired thickness. The carrier body itself is no longer shown in FIG. 2, in order to make the illustration clearer.

In FIG. 2 *a*) to *e*), a detail having a separation region TB between two adjacent integrated circuit regions $IB_N$ and $IB_{N+1}$ is shown, in each instance, in a side cross-section view, in the left half of the figure, and a detail from a region $IB_N$ of an integrated circuit having interfacial connections with passage holes is shown in the right half of the figure. The drawings are not to scale.

Figure 2A:
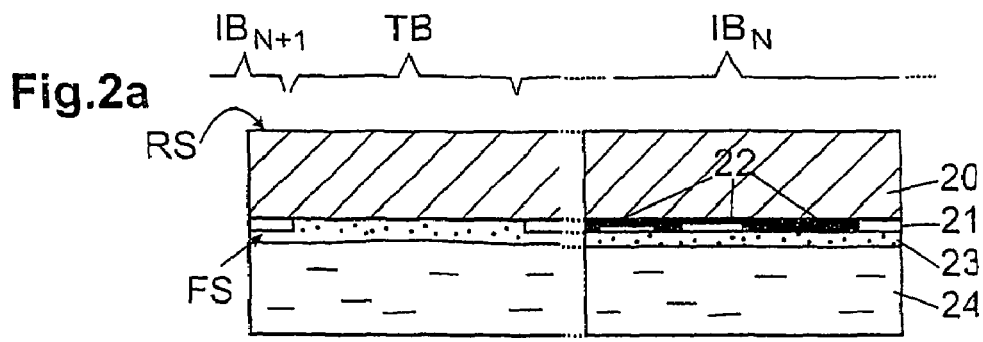
Figure 2B:
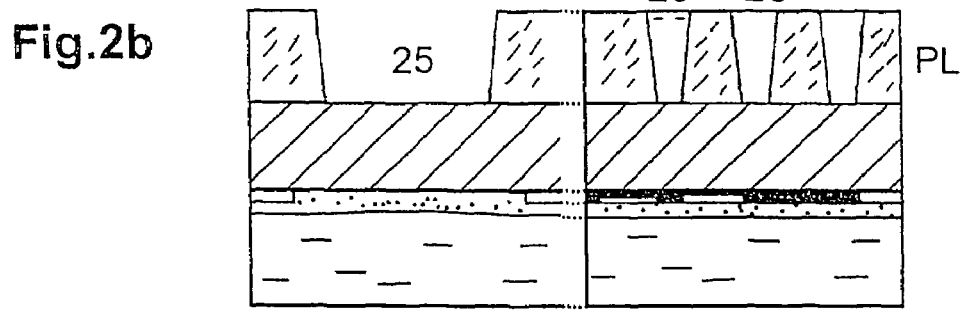

On the front face of the substrate 20 that has been reduced in thickness, facing the carrier body, the circuit plane having conductive surfaces 22 is indicated as 21; it is covered by the protective layer 23 (FIG. 2*a*).

On the back face RS of the substrate 20 that has been reduced in thickness, a photoresist layer PL was applied, and first openings 25 for separating trenches were structured in the separation region TB, and second openings 26 for passage holes to conductive surfaces were structured in the circuit region IB of the individual integrated circuits.

Figure 2C:
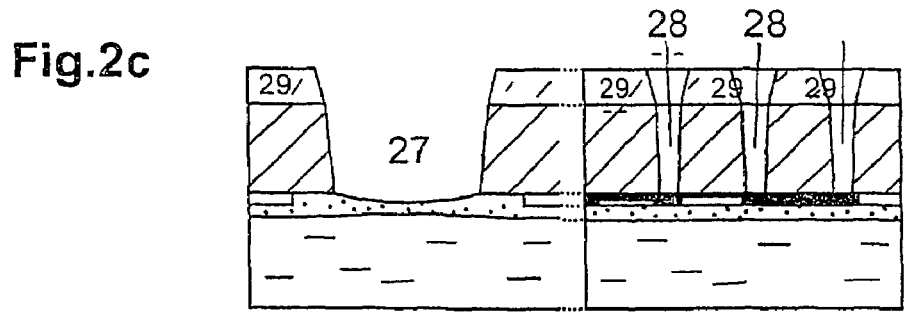
Figure 2D:
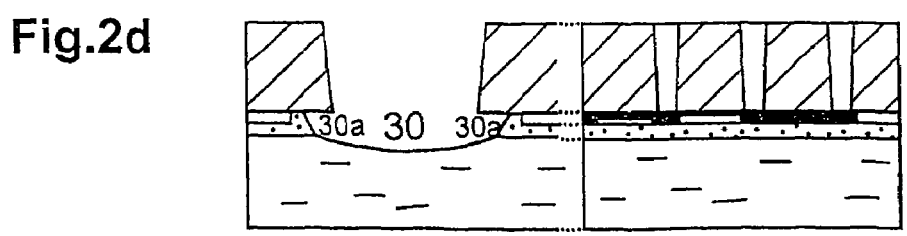
Figure 2E:
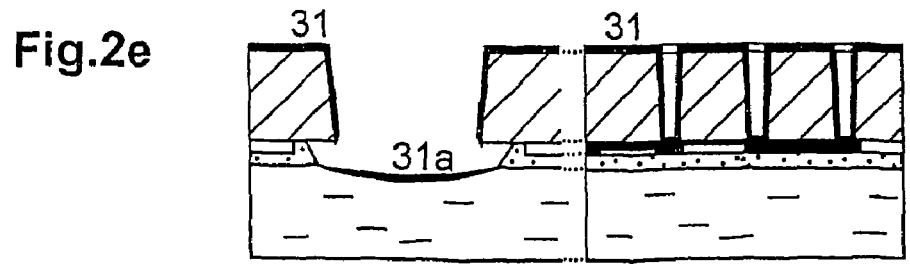

In a first common etching step, using the structured photoresist layer PL, separating trenches 27 are etched clear in the separation region TB, and passage holes 28 through the semiconductor substrate 20 are etched clear in the circuit region IB. The etching parameters are adjusted in such a manner that the passage holes narrow conically from the back face RS towards the front face, with slanted flanks. This manner of etching passage holes is generally used. The etching process for the passage holes automatically stops at the conductive surfaces 22 of the circuit plane 21 in the circuit region IB, because of the selection of the etching agent and the adjustment of the etching parameters, whereas the etching process continues into the protective layer 23 in the separation region TB, in which no such conductive surfaces are present (FIG. 2*c*).

The etching process is continued in a second etching step, preferably with a change in the etching agent and/or a change in the etching parameters, whereby preferably, the substrate material is not removed any more and whereby the conductive surfaces 22 are not attacked in the circuit region IB, whereas the material of the protective layer 23, under the separating trench 27, in the separation region TB, is removed in a depression that reaches to or into the glue material 24. The etching agent and the etching parameters are selected in such a manner that the material of the protective layer is removed even laterally under the substrate 20, so that an overhang 30*a* is formed by means of under-etching of the substrate. According to a preferred embodiment, etching of the depression 30 in the protective layer 23, including the overhangs 30a, takes place together with removal of the photoresist mask 29.

During the subsequent deposition of the back face metallization 31, which is directed over the entire area, the metal film 31a that is deposited on the glue material, in the depression 30, is interrupted by the steps at the overhangs 30a, as compared with the metallization on the back face and side flanks of the substrate 20. In the passage holes, the back face metallization 31 forms a continuous metal film along the slanted edges, up to the conductive surfaces 22, in conventional manner, by way of which the conductive surfaces 22, contacted in this manner, can be laid to the electrical potential of the back face metallization 31.

The integrated circuits laterally separated by the separating trenches 27 that go through to the glue material (including the depressions 30) can be individually released from the glue material by means of a release force that acts perpendicular to the substrate plane and overcomes the adhesion force of the glue material to the protective layer 23. By means of the selection of a glue material that demonstrates a clear reduction in adhesive strength when heated, and by means of heating this glue material, preferably by way of the carrier body, the individual circuit arrangements can be individually removed with low release force, for further treatment. To lift the individual circuit arrangements off the carrier body TR, counter to a low adhesion force, and for their further handling, it is advantageous to use so-called vacuum tweezers 4 as schematically shown in FIG. 3.

After a circuit arrangement (chip) IC has been lifted from the carrier body TR (FIG. 3A), in the sequence of handling steps shown in FIG. 3, the chip IC, held on the back face with the vacuum tweezers 4, is turned (FIG. 3B) and cleaned by means of a solvent jet 5 (FIG. 3C), and subsequently dried with inert gas (FIG. 3D). Another pair of vacuum tweezers 7 takes the chip over on the front face (FIG. 3E) and lays it onto the grounded electrostatic base plate 10 (FIG. 3F) with the metallized back face. The chip held electrostatically on the base plate 10 is subjected to an automatic optical inspection 9 (FIG. 3G) and, in this connection, advantageously adjusted in defined manner by means of rotation and/or displacement of the base plate, or on the base plate in the plate plane 8, and thereby oriented for a subsequent electrical measurement 11 (FIG. 3H).

The chips that pass the optical and electrical inspection can be set into a storage or shipping area 13 (FIG. 3I).

The characteristics indicated above and in the claims, as well as those that can be derived from the figures, can advantageously be implemented both individually and in various combinations. The invention is not restricted to the exemplary embodiments described, but rather can be modified in many different ways, within the scope of the ability of a person skilled in the art.

The invention claimed is:

1. A method for producing individual monolithically integrated semiconductor circuit arrangements from a wafer composite substrate comprising the following steps:
   (a) forming a plurality of separate component structures comprising monolithic semiconductor circuits and conductive surfaces on a front face surface of a wafer;
   (b) covering the front face surface of the wafer with a protective layer to form a wafer composite substrate;
   (c) attaching the wafer to a support via an attachment layer applied over the support;
   (d) reducing the substrate to a selected thickness;
   (e) producing passage holes through the substrate up to the conductive surfaces on the front face surface;
   (f) producing separating trenches between the monolithic semiconductor circuits up to or into the attachment layer, including removal of the protective layer under the separating trenches and lateral under-etching of the substrate;
   (g) depositing a back face metallization on a back face of the substrate and forming electrical connections through the passage holes; and
   (h) individually releasing the semiconductor circuits from the support for further individual processing.

2. The method as recited in claim 1, wherein an adhesive material is used for the attachment layer.

3. The method as recited in claim 2, wherein an adhesive material having a lower adhesion to the front face surface of the wafer at a higher temperature is used.

4. The method as recited in claim 2 wherein the semiconductor circuits are individually released from the carrier mechanically by overcoming the adhesion force of the attachment layer to the front face surface of the wafer.

5. The method as recited in claim 1, wherein the substrate is reduced in thickness to a thickness of less than 100 μm.

6. The method as recited in claim 1 wherein the separating trenches are produced by means of a photolithographic etching process.

7. The method as recited in claim 6, wherein a common photolithographic mask is used for the production of the passage holes and the separating trenches.

8. The method as recited in claim 1, wherein the back face metallization is deposited after production of the separating trenches.

9. The method as recited in claim 1, wherein an electrical function test of the semiconductor circuits is performed after separation.

* * * * *

UNITED STATES PATENT AND TRADEMARK OFFICE
CERTIFICATE OF CORRECTION

PATENT NO. : 7,084,047 B2  
APPLICATION NO. : 10/524251  
DATED : August 1, 2006  
INVENTOR(S) : Behammer It is certified that error appears in the above-identified patent and that said Letters Patent is hereby corrected as shown below:

In particular, in Column 6, line 3 (line 2 of Claim 1), please change "water" to: --wafer--.

In Column 6, line 10 (Line 9 of Claim 1), please change "water" to: --wafer--.

Signed and Sealed this

Tenth Day of October, 2006

JON W. DUDAS  
*Director of the United States Patent and Trademark Office*